US010060992B2

(12) United States Patent
Komasaki (10) Patent No.: US 10,060,992 B2
(45) Date of Patent: Aug. 28, 2018

(54) MAGNETIC SENSOR INCLUDING BIAS MAGNETIC FIELD GENERATION UNIT FOR GENERATING STABLE BIAS MAGNETIC FIELD

(71) Applicant: TDK CORPORATION, Tokyo (JP)

(72) Inventor: Yosuke Komasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 158 days.

(21) Appl. No.: 14/955,757

(22) Filed: Dec. 1, 2015

(65) Prior Publication Data

US 2016/0238674 A1    Aug. 18, 2016

(30) Foreign Application Priority Data

Feb. 17, 2015    (JP) .................................. 2015-028145

(51) Int. Cl.
 *G01R 33/09*    (2006.01)

(52) U.S. Cl.
 CPC .................................. *G01R 33/093* (2013.01)

(58) Field of Classification Search
 USPC .................................. 324/252, 246, 247, 249
 See application file for complete search history.

(56) References Cited

U.S. PATENT DOCUMENTS

| 5,764,056 | A | 6/1998 | Mao et al. | |
| 6,661,225 | B2 | 12/2003 | Toyoda et al. | |
| 9,099,123 | B1* | 8/2015 | Wagatsuma | G11B 5/3909 |
| 2003/0011944 | A1* | 1/2003 | Hosomi | B82Y 10/00 |
| | | | | 360/324.1 |
| 2008/0239588 | A1 | 10/2008 | Takashita et al. | |
| 2010/0149689 | A1* | 6/2010 | Tsuchiya | B82Y 10/00 |
| | | | | 360/234.3 |

FOREIGN PATENT DOCUMENTS

| CN | 101330125 A | 12/2008 |
| JP | 2004-119424 A | 4/2004 |
| JP | 2008-151759 A | 7/2008 |
| JP | 2009-042105 A | 2/2009 |
| JP | 2012-185044 A | 9/2012 |
| WO | 2015/010649 A1 | 1/2015 |

OTHER PUBLICATIONS

Jun. 22, 2017 Office Action issued in German Patent Application No. 102016102601.8.
May 2, 2018 Office Action issued in Chinese Patent Application No. 201610089953.9.

* cited by examiner

*Primary Examiner* — Vincent Q Nguyen
(74) *Attorney, Agent, or Firm* — Oliff PLC (57) ABSTRACT

A magnetic sensor includes an MR element and a bias magnetic field generation unit. The MR element includes a magnetization pinned layer, a nonmagnetic layer and a free layer stacked along Z direction. The bias magnetic field generation unit includes a first antiferromagnetic layer, a ferromagnetic layer and a second antiferromagnetic layer stacked along the Z direction. The bias magnetic field generation unit has a first end face and and a second end face located at opposite ends in the Z direction. The MR element is placed such that the entirety of the MR element is contained in a space formed by shifting an imaginary plane equivalent to the first end face of the bias magnetic field generation unit away from the second end face along the Z direction.

9 Claims, 8 Drawing Sheets

MAGNETIC SENSOR INCLUDING BIAS MAGNETIC FIELD GENERATION UNIT FOR GENERATING STABLE BIAS MAGNETIC FIELD

BACKGROUND OF THE INVENTION

1. Field of the Invention

The present invention relates to a magnetic sensor including a magnetic detection element and a bias magnetic field generation unit, the bias magnetic field generation unit generating a bias magnetic field to be applied to the magnetic detection element.

2. Description of the Related Art

In recent years, magnetic sensor systems have been employed to detect a physical quantity associated with the rotational movement or linear movement of a moving object in a variety of applications. Typically, a magnetic sensor system includes a scale and a magnetic sensor, and the magnetic sensor is configured to generate a signal associated with the relative positional relationship between the scale and the magnetic sensor.

The magnetic sensor includes a magnetic detection element for detecting a magnetic field to be detected. Hereinafter, the magnetic field to be detected will be referred to as the target magnetic field. U.S. Pat. No. 6,661,225 B2, JP 2008-151759A, and JP 2012-185044A each disclose a magnetic sensor that uses a so-called spin-valve magnetoresistance (MR) element as the magnetic detection element. The spin-valve MR element includes a magnetization pinned layer having a magnetization pinned in a certain direction, a free layer having a magnetization that varies depending on the target magnetic field, and a nonmagnetic layer located between the magnetization pinned layer and the free layer. Examples of the spin-valve MR element include a TMR element in which the nonmagnetic layer is a tunnel barrier layer, and a GMR element in which the nonmagnetic layer is a nonmagnetic conductive layer.

Some magnetic sensors have means for applying a bias magnetic field to the magnetic detection element. The bias magnetic field is used to allow the magnetic detection element to respond linearly to a variation in the strength of the target magnetic field. In a magnetic sensor that uses a spin-valve MR element, the bias magnetic field is used also to make the free layer have a single magnetic domain and to orient the magnetization of the free layer in a certain direction, when there is no target magnetic field.

U.S. Pat. No. 6,661,225 B2 and JP 2008-151759A each disclose a magnetic sensor including a spin-valve MR element, and a permanent magnet for generating a bias magnetic field.

JP 2012-185044A discloses a magnetic sensor including a spin-valve MR element, and an antiferromagnetic layer that is in contact with the free layer of the MR element and induces an exchange coupling magnetic field between the free layer and itself.

Magnetic sensors that use a permanent magnet as the means for generating a bias magnetic field, such as those disclosed in U.S. Pat. No. 6,661,225 B2 and JP 2008-151759A, have the following problems. Such magnetic sensors are typically used under the condition that the strength of the target magnetic field does not exceed the coercivity of the permanent magnet. However, since the magnetic sensors can be used in various environments, an external magnetic field having a strength exceeding the coercivity of the permanent magnet can happen to be temporarily applied to the permanent magnet. When such an external magnetic field is temporarily applied to the permanent magnet, the magnetization direction of the permanent magnet may be changed from an original direction and then remain different from the original direction even after the external magnetic field disappears. In such a case, the direction of the bias magnetic field differs from a desired direction.

On the other hand, as described in JP 2012-185044A, a magnetic sensor having an antiferromagnetic layer in contact with the free layer of the MR element has the following first and second problems. The first problem is that the antiferromagnetic layer is exchange-coupled to the free layer to create magnetic anisotropy in the free layer, and as a result, the free layer increases in coercivity, and the linearity of a response of the MR element to the target magnetic field can thus possibly deteriorate. The second problem is that atoms constituting the antiferromagnetic layer, such as Mn atoms in a Mn-based antiferromagnetic material such as IrMn, may diffuse into the free layer, and as a result, the magnetoresistance change ratio of the MR element may be reduced.

OBJECT AND SUMMARY OF THE INVENTION

It is an object of the present invention to provide a magnetic sensor that allows application of a stable bias magnetic field to a magnetic detection element.

A magnetic sensor of the present invention includes at least one magnetic detection element for detecting a target magnetic field, and a bias magnetic field generation unit for generating a bias magnetic field to be applied to the at least one magnetic detection element. The bias magnetic field generation unit includes a ferromagnetic layer and a first antiferromagnetic layer that are stacked along a first direction, and has a first end face and a second end face located at opposite ends in the first direction. The ferromagnetic layer has a first surface and a second surface located at opposite ends in the first direction. The first antiferromagnetic layer is in contact with the first surface of the ferromagnetic layer and exchange-coupled to the ferromagnetic layer. The at least one magnetic detection element is placed such that at least a part of each of the at least one magnetic detection element is contained in a space formed by shifting an imaginary plane equivalent to the first end face of the bias magnetic field generation unit away from the second end face along the first direction.

In the magnetic sensor of the present invention, the ferromagnetic layer may have a magnetization in a direction parallel to a second direction orthogonal to the first direction. The bias magnetic field at a location where the at least one magnetic detection element is placed may contain a component in a direction opposite to the direction of the magnetization of the ferromagnetic layer.

The first end face of the bias magnetic field generation unit may include a first end region, a second end region and a middle region each of which has an area. The first end region includes a first end of the first end face, the first end being one of opposite ends of the first end face in the second direction. The second end region includes a second end of the first end face, the second end being the other of the opposite ends of the first end face in the second direction. The middle region is located between the first end region and the second end region, borders on the first end region along a first border line orthogonal to the second direction, and borders on the second end region along a second border line orthogonal to the second direction. The at least one magnetic detection element may be placed such that the entirety of the at least one magnetic detection element is contained in a space formed by shifting an imaginary plane equivalent to the middle region away from the second end face of the bias magnetic field generation unit along the first direction. The distance between the first end and the first border line, and the distance between the second end and the second border line may both be 10% or 35% of the distance between the first end and the second end.

In the magnetic sensor of the present invention, the at least one magnetic detection element may be at least one magnetoresistance element. The at least one magnetoresistance element may include a magnetization pinned layer having a magnetization pinned in a certain direction, a free layer having a magnetization that varies depending on the target magnetic field, and a nonmagnetic layer located between the magnetization pinned layer and the free layer. The magnetization pinned layer, the nonmagnetic layer and the free layer may be stacked along the first direction. The magnetic sensor of the present invention may further include a first electrode and a second electrode for supplying current to the at least one magnetoresistance element, the first and second electrodes being located on opposite sides of the at least one magnetoresistance element in the first direction. In this case, the bias magnetic field generation unit may be located between the first electrode and the at least one magnetoresistance element.

In the magnetic sensor of the present invention, the bias magnetic field generation unit may further include a second antiferromagnetic layer that is in contact with the second surface of the ferromagnetic layer and exchange-coupled to the ferromagnetic layer.

In the bias magnetic field generation unit of the magnetic sensor of the present invention, the direction of the magnetization of the ferromagnetic layer is determined by the exchange coupling between the first antiferromagnetic layer and the ferromagnetic layer. In this bias magnetic field generation unit, even if an external magnetic field having a high strength sufficient to reverse the direction of the magnetization of the ferromagnetic layer is temporarily applied, the direction of the magnetization of the ferromagnetic layer returns to an original direction upon disappearance of such an external magnetic field. Thus, the magnetic sensor of the present invention allows application of a stable bias magnetic field to the magnetic detection element.

Other and further objects, features and advantages of the present invention will appear more fully from the following description.

DETAILED DESCRIPTION OF THE PREFERRED EMBODIMENTS

First Embodiment

Figure 1:
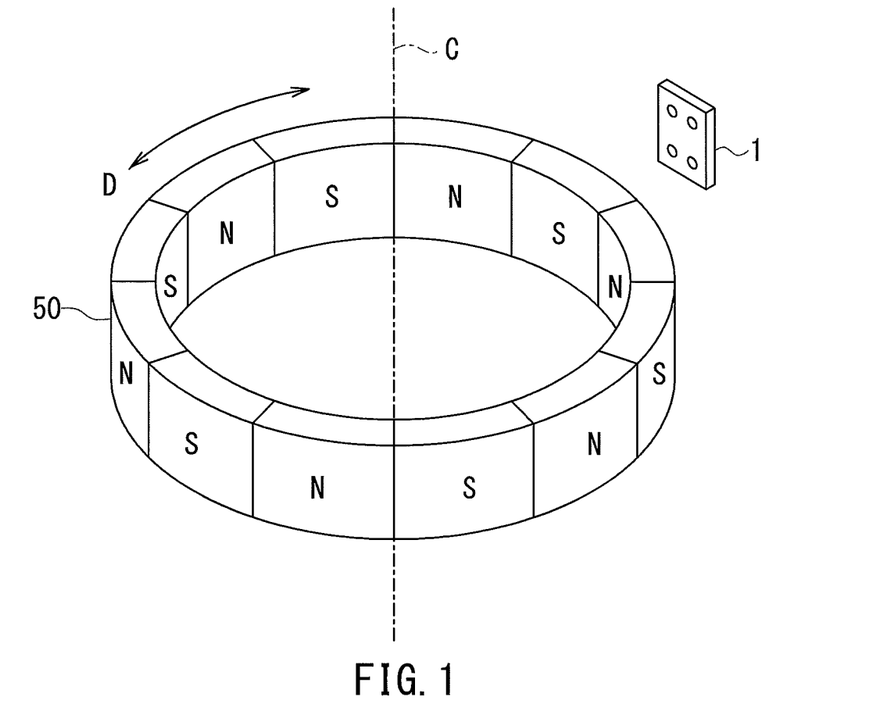
FIG. 1 is a perspective view illustrating the general configuration of a magnetic sensor system of a first embodiment of the invention.

Preferred embodiments of the present invention will now be described in detail with reference to the drawings. First, reference is made to FIG. 1 to describe an example of a magnetic sensor system including a magnetic sensor according to a first embodiment of the invention. FIG. 1 is a perspective view illustrating the general configuration of the magnetic sensor system of the first embodiment. The magnetic sensor system shown in FIG. 1 includes the magnetic sensor 1 according to the first embodiment, and a rotation scale 50 for generating a target magnetic field, i.e., a magnetic field to be detected by the magnetic sensor 1. In response to a rotational movement of a moving object (not illustrated), the rotation scale 50 rotates about a predetermined central axis C in a rotational direction D. The relative positional relationship between the rotation scale 50 and the magnetic sensor 1 is thereby changed in the rotational direction D. The magnetic sensor system detects a physical quantity associated with the relative positional relationship between the rotation scale 50 and the magnetic sensor 1. More specifically, the magnetic sensor system detects, as the aforementioned physical quantity, the rotational position and/or the rotational speed of the aforementioned moving body moving with the rotation scale 50.

As shown in FIG. 1, the rotation scale 50 is a multipole-magnetized magnet having a plurality of pairs of N and S poles alternately arranged in a circumferential direction. In the example shown in FIG. 1, the rotation scale 50 has six pairs of N and S poles. The magnetic sensor 1 is placed to face the outer circumferential surface of the rotation scale 50.

The direction of the target magnetic field varies periodically with varying relative positional relationship between the rotation scale 50 and the magnetic sensor 1. In the first embodiment, the direction of the target magnetic field changes as the rotation scale 50 rotates. In the example shown in FIG. 1, one rotation of the rotation scale 50 causes the direction of the target magnetic field to rotate six times, that is, to change by six periods.

Figure 2:
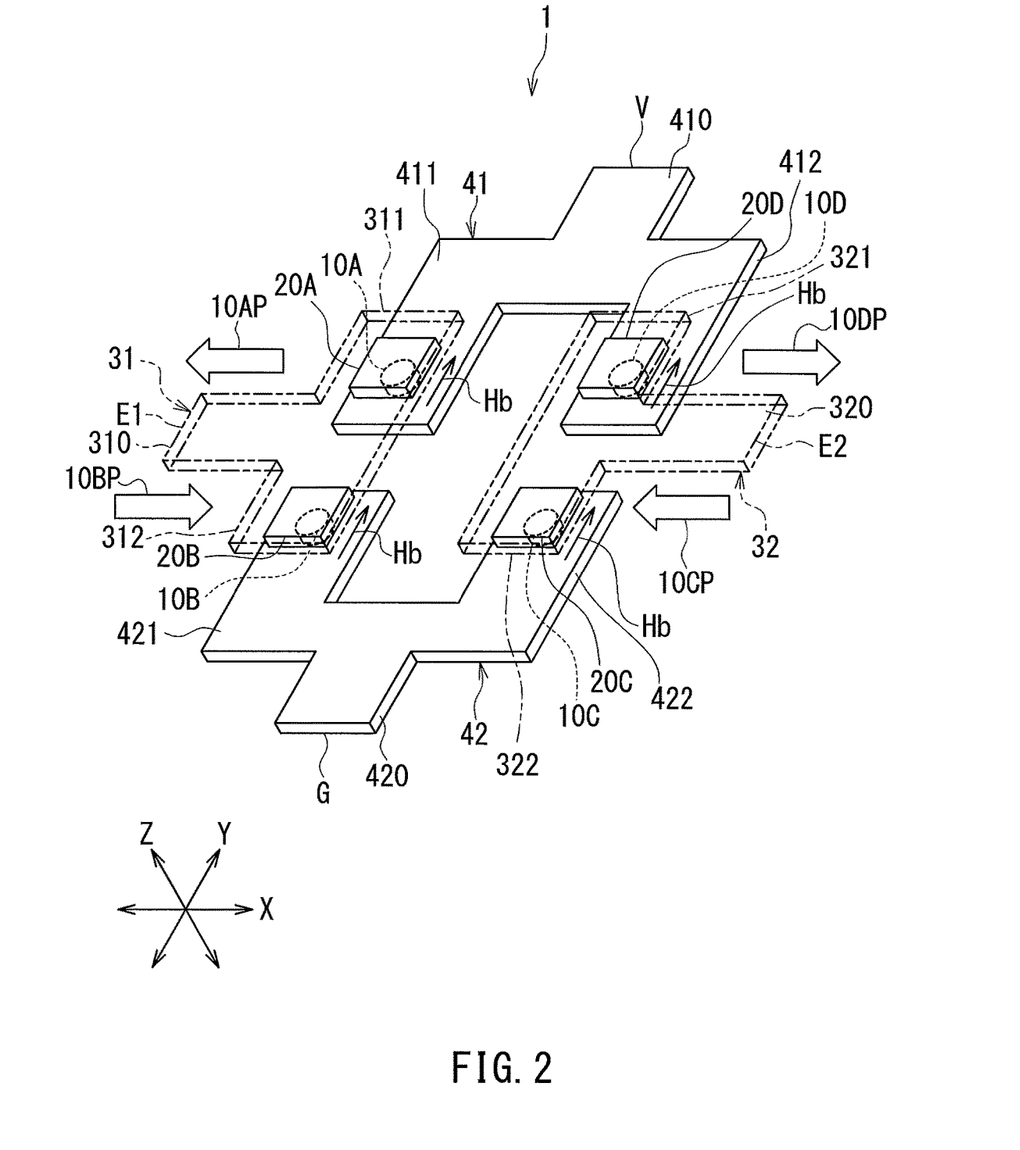
FIG. 2 is a perspective view of a magnetic sensor according to the first embodiment of the invention.
Figure 3:
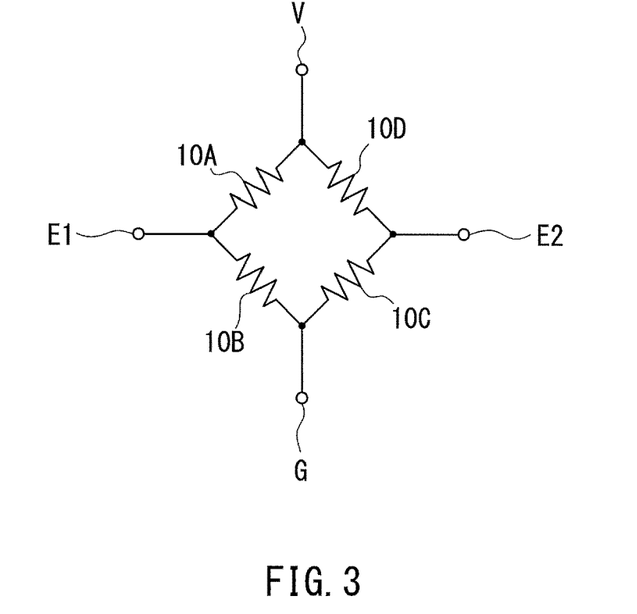
FIG. 3 is a circuit diagram of the magnetic sensor according to the first embodiment of the invention.

The magnetic sensor 1 will now be described with reference to FIG. 2 and FIG. 3. FIG. 2 is a perspective view of the magnetic sensor 1. FIG. 3 is a circuit diagram of the magnetic sensor 1. The magnetic sensor 1 includes at least one magnetic detection element for detecting the target magnetic field, and at least one bias magnetic field generation unit for generating a bias magnetic field to be applied to the at least one magnetic detection element. In the first embodiment, the at least one magnetic detection element is at least one magnetoresistance (MR) element. The first embodiment employs a spin-valve MR element as the MR element. As will be described in detail later, the spin-valve MR element includes a magnetization pinned layer, a free layer, and a nonmagnetic layer located between the magnetization pinned layer and the free layer. The magnetization pinned layer, the nonmagnetic layer and the free layer are stacked along a first direction. In the first embodiment, the first direction is defined as Z direction. X and Y directions are two directions perpendicular to the Z direction and orthogonal to each other.

As used herein, each of the X, Y and Z directions is defined as including one particular direction and the opposite direction thereto, as indicated by the respective double-headed arrows in FIG. 2. On the other hand, the direction of any magnetic field or magnetization is defined as indicating a single particular direction.

In the first embodiment, in particular, the magnetic sensor 1 includes four MR elements 10A, 10B, 10C and 10D as the at least one MR element. The magnetic sensor 1 further includes, as the at least one bias magnetic field generation unit, four bias magnetic field generation units 20A, 20B, 20C and 20D corresponding to the MR elements 10A, 10B, 10C and 10D, respectively. The bias magnetic field generation units 20A, 20B, 20C and 20D generate respective bias magnetic fields to be applied to the corresponding MR elements 10A, 10B, 10C and 10D. Hereinafter, reference numeral 10 will be used to represent any of the MR elements, and reference numeral 20 will be used to represent any of the bias magnetic field generation units.

The magnetic sensor 1 further includes a substrate (not illustrated), two upper electrodes 31 and 32, and two lower electrodes 41 and 42. The lower electrodes 41 and 42 are placed on the non-illustrated substrate. The upper electrode 31 has a base part 310, and two branch parts 311 and 312 branching off from the base part 310. The upper electrode 32 has a base part 320, and two branch parts 321 and 322 branching off from the base part 320. The lower electrode 41 has a base part 410, and two branch parts 411 and 412 branching off from the base part 410. The lower electrode 42 has a base part 420, and two branch parts 421 and 422 branching off from the base parts 420. The branch part 311 of the upper electrode 31 is opposed to the branch part 411 of the lower electrode 41. The branch part 312 of the upper electrode 31 is opposed to the branch part 421 of the lower electrode 42. The branch part 321 of the upper electrode 32 is opposed to the branch part 412 of the lower electrode 41. The branch part 322 of the upper electrode 32 is opposed to the branch part 422 of the lower electrode 42.

The MR element 10A is placed on the branch part 411 of the lower electrode 41. The MR element 10B is placed on the branch part 421 of the lower electrode 42. The MR element 10C is placed on the branch part 422 of the lower electrode 42. The MR element 10D is placed on the branch part 412 of the lower electrode 41. The bias magnetic field generation units 20A, 20B, 20C and 20D are placed on the MR elements 10A, 10B, 10C and 10D, respectively. The branch part 311 of the upper electrode 31 is located on the bias magnetic field generation unit 20A. The branch part 312 of the upper electrode 31 is located on the bias magnetic field generation unit 20B. The branch part 322 of the upper electrode 32 is located on the bias magnetic field generation unit 20C. The branch part 321 of the upper electrode 32 is located on the bias magnetic field generation unit 20D.

The upper electrode 31 and the lower electrode 41 are located on opposite sides of the MR element 10A in the first direction (Z direction), and supply current to the MR element 10A. The bias magnetic field generation unit 20A is located between the upper electrode 31 and the MR element 10A.

The upper electrode 31 and the lower electrode 42 are located on opposite sides of the MR element 10B in the first direction (Z direction), and supply current to the MR element 10B. The bias magnetic field generation unit 20B is located between the upper electrode 31 and the MR element 10B.

The upper electrode 32 and the lower electrode 42 are located on opposite sides of the MR element 10C in the first direction (Z direction), and supply current to the MR element 10C. The bias magnetic field generation unit 20C is located between the upper electrode 32 and the MR element 10C.

The upper electrode 32 and the lower electrode 41 are located on opposite sides of the MR element 10D in the first direction (Z direction), and supply current to the MR element 10D. The bias magnetic field generation unit 20D is located between the upper electrode 32 and the MR element 10D.

The upper electrodes 31 and 32 each correspond to the first electrode of the present invention. The lower electrodes 41 and 42 each correspond to the second electrode of the present invention.

As shown in FIG. 2, the base part 310 of the upper electrode 31 includes a first output port E1. The base part 320 of the upper electrode 32 includes a second output port E2. The base part 410 of the lower electrode 41 includes a power supply port V. The base part 420 of the lower electrode 42 includes a ground port G.

The MR element 10A and the MR element 10B are connected in series via the upper electrode 31. The MR element 10C and the MR element 10D are connected in series via the upper electrode 32.

As shown in FIG. 3, one end of the MR element 10A is connected to the power supply port V. The other end of the MR element 10A is connected to the first output port E1. One end of the MR element 10B is connected to the first output port E1. The other end of the MR element 10B is connected to the ground port G. The MR elements 10A and 10B constitute a half-bridge circuit. One end of the MR element 10C is connected to the second output port E2. The other end of the MR element 10C is connected to the ground port G. One end of the MR element 10D is connected to the power supply port V. The other end of the MR element 10D is connected to the second output port E2. The MR elements 10C and 10D constitute a half-bridge circuit. The MR elements 10A, 10B, 10C and 10D constitute a Wheatstone bridge circuit.

A power supply voltage of a predetermined magnitude is applied to the power supply port V1. The ground port G is grounded. Each of the MR elements 10A, 10B, 10C and 10D varies in resistance depending on the target magnetic field. The resistances of the MR elements 10A and 10C vary in phase with each other. The resistances of the MR elements 10B and 10D vary 180° out of phase with the resistances of the MR elements 10A and 10C. The first output port E1 outputs a first detection signal corresponding to the potential at the connection point between the MR elements 10A and 10B. The second output port E2 outputs a second detection signal corresponding to the potential at the connection point between the MR elements 10D and 10C. The first and second detection signals vary depending on the target magnetic field. The second detection signal is 180° out of phase with the first detection signal. The magnetic sensor 1 generates an output signal by computation including determining the difference between the first detection signal and the second detection signal. For example, the output signal of the magnetic sensor 1 is generated by adding a predetermined offset voltage to a signal obtained by subtracting the second detection signal from the first detection signal. The output signal of the magnetic sensor 1 varies depending on the target magnetic field.

Figure 4:
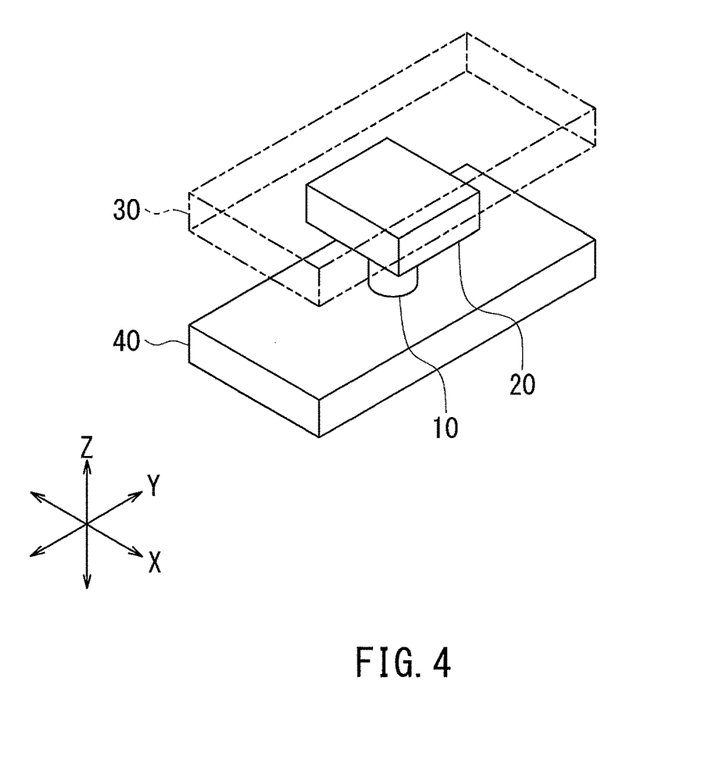
FIG. 4 is an enlarged perspective view of a portion of the magnetic sensor shown in FIG. 2.
Figure 5:
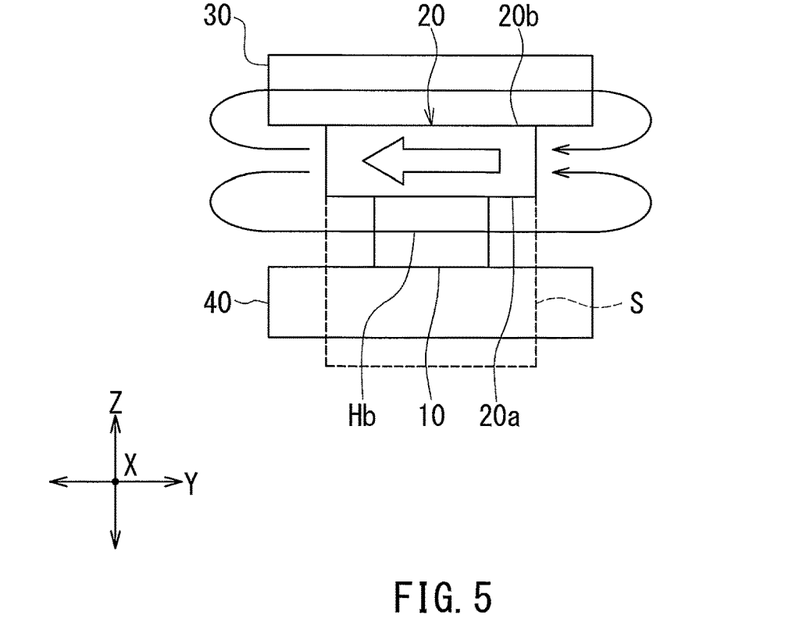
FIG. 5 is an enlarged side view of the portion of the magnetic sensor shown in FIG. 2.
Figure 6:
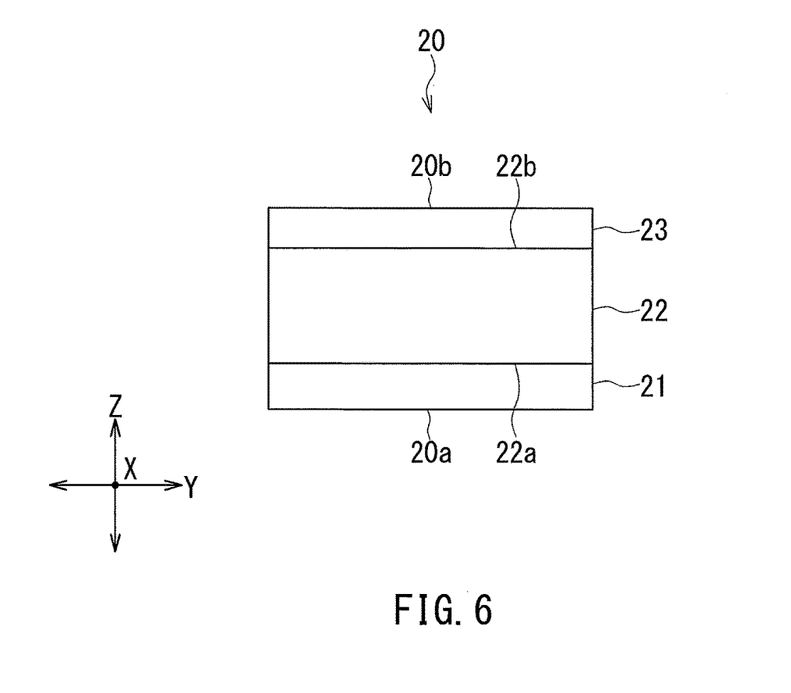
FIG. 6 is a side view illustrating an example of the configuration of the bias magnetic field generation unit shown in FIG. 2.

The bias magnetic field generation unit 20 will now be described in detail with reference to FIG. 4 to FIG. 6. FIG. 4 is an enlarged perspective view of a portion of the magnetic sensor 1 shown in FIG. 2. FIG. 5 is an enlarged side view of the portion of the magnetic sensor 1 shown in FIG. 2. FIG. 6 is a side view illustrating an example of the configuration of the bias magnetic field generation unit 20 shown in FIG. 2. In FIG. 4 and FIG. 5, the reference numeral 30 is used to represent whichever one of the upper electrodes (first electrodes), and the reference numeral 40 is used to represent whichever one of the lower electrodes (second electrodes).

As shown in FIG. 6, the bias magnetic field generation unit 20 has a first end face 20a and a second end face 20b located at opposite ends in the first direction (Z direction). As shown in FIG. 5, the first end face 20a faces toward the lower electrode 40 and is in contact with the MR element 10. The second end face 20b is in contact with the upper electrode 30.

As shown in FIG. 6, the bias magnetic field generation unit 20 includes a ferromagnetic layer 22 and a first antiferromagnetic layer 21 stacked along the first direction. The ferromagnetic layer 22 has a first surface 22a and a second surface 22b located at opposite ends in the first direction (Z direction). The first antiferromagnetic layer 21 is in contact with the first surface 22a of the ferromagnetic layer 22 and exchange-coupled to the ferromagnetic layer 22. In the example shown in FIG. 6, the bias magnetic field generation unit 20 further includes a second antiferromagnetic layer 23 in contact with the second surface 22b of the ferromagnetic layer 22 and exchange-coupled to the ferromagnetic layer 22. In this example, the first antiferromagnetic layer 21, the ferromagnetic layer 22 and the second antiferromagnetic layer 23 are stacked in this order along the first direction.

The ferromagnetic layer 22 has a magnetization in a direction parallel to a second direction orthogonal to the first direction (Z direction). In the first embodiment, the second direction is the Y direction. In the bias magnetic field generation unit 20, the direction of the magnetization of the ferromagnetic layer 22 is determined by the exchange coupling between the ferromagnetic layer 22 and the first and second antiferromagnetic layers 21 and 23. The hollow arrow in FIG. 5 indicates the direction of the magnetization of the ferromagnetic layer 22. On the basis of the magnetization of the ferromagnetic layer 22, the bias magnetic field generation unit 20 generates magnetic fields including a bias magnetic field Hb to be applied to the MR element 10. The curved arrows in FIG. 5 represent the magnetic fields generated by the bias magnetic field generation unit 20. The bias magnetic field Hb at the location where the MR element 10 is placed contains, as a principal component, a component parallel to the second direction (Y direction) and oriented in a direction opposite to the direction of the magnetization of the ferromagnetic layer 22.

The ferromagnetic layer 22 is formed of a ferromagnetic material containing one or more elements selected from the group consisting of Co, Fe and Ni. Examples of such a ferromagnetic material include CoFe, CoFeB, and CoNiFe. The ferromagnetic layer 22 may be formed of a stack of two or more layers in which every adjacent two layers are formed of different ferromagnetic materials. Examples of such a stack forming the ferromagnetic layer 22 include a stack of a Co layer, a CoFe layer and a Co layer, and a stack of a $Co_{70}Fe_{30}$ layer, a $Co_{30}Fe_{70}$ layer and a $Co_{70}Fe_{30}$ layer. Note that $Co_{70}Fe_{30}$ represents an alloy containing 70 atomic percent Co and 30 atomic percent Fe, and $Co_{30}Fe_{70}$ represents an alloy containing 30 atomic percent Co and 70 atomic percent Fe. The first and second antiferromagnetic layers 21 and 23 are each formed of an antiferromagnetic material such as IrMn or PtMn. The ferromagnetic layer 22 preferably has a thickness of 8 nm or more. Assuming that the ferromagnetic layer 22 is formed of CoFe and has a thickness of 8 nm, the bias magnetic field generation unit 20 can generate a bias magnetic field Hb having a strength of the order of 10 Oe. Note that 1 Oe=79.6 A/m.

The second antiferromagnetic layer 23 is not an essential component of the bias magnetic field generation unit 20, and can be dispensed with.

Figure 7:
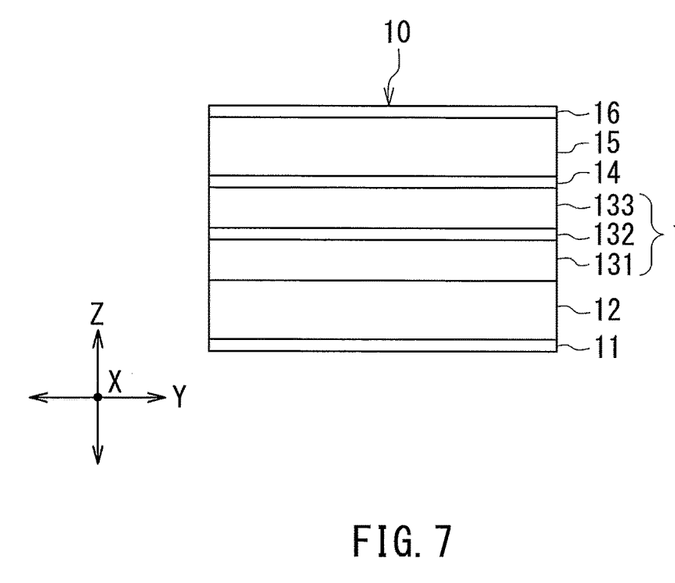
FIG. 7 is a side view illustrating an example of the configuration of the MR element shown in FIG. 2.

An example of the configuration of the MR element 10 will now be described with reference to FIG. 7. FIG. 7 is a side view illustrating an example of the configuration of the MR element 10. The MR element 10 includes at least a magnetization pinned layer 13 having a magnetization pinned in a certain direction, a free layer 15 having a magnetization that varies depending on the target magnetic field, and a nonmagnetic layer 14 located between the magnetization pinned layer 13 and the free layer 15.

In the example shown in FIG. 7, the MR element 10 further includes an underlayer 11, an antiferromagnetic layer 12 and a protective layer 16. In this example, the underlayer 11, the antiferromagnetic layer 12, the magnetization pinned layer 13, the nonmagnetic layer 14, the free layer 15 and the protective layer 16 are stacked along the first direction (Z direction) in the listed order as viewed from the lower electrode 40. The underlayer 11 and the protective layer 16 are conductive. The underlayer 11 is provided to eliminate the effects of the crystal axis of the non-illustrated substrate and to improve the crystallinity and orientability of the layers to be formed over the underlayer 11. The underlayer 11 may be formed of Ta or Ru, for example. The antiferromagnetic layer 12 is to pin the direction of the magnetization of the magnetization pinned layer 13 by means of exchange coupling with the magnetization pinned layer 13. The antiferromagnetic layer 12 is formed of an antiferromagnetic material such as IrMn or PtMn.

The magnetization of the magnetization pinned layer 13 is pinned in a certain direction by the exchange coupling between the antiferromagnetic layer 12 and the magnetization pinned layer 13. In the example shown in FIG. 7, the magnetization pinned layer 13 includes an outer layer 131, a nonmagnetic intermediate layer 132 and an inner layer 133 stacked in this order on the antiferromagnetic layer 12, and is thus formed as a so-called synthetic pinned layer. The outer layer 131 and the inner layer 133 are each formed of a ferromagnetic material such as CoFe, CoFeB or CoNiFe. The outer layer 131 is exchange-coupled to the antiferromagnetic layer 12 and thus the magnetization direction thereof is pinned. The outer layer 131 and the inner layer 133 are antiferromagnetically coupled to each other, and their magnetizations are thus pinned in mutually opposite directions. The nonmagnetic intermediate layer 132 induces antiferromagnetic exchange coupling between the outer layer 131 and the inner layer 133 so as to pin the magnetizations of the outer layer 131 and the inner layer 133 in mutually opposite directions. The nonmagnetic intermediate layer 132 is formed of a nonmagnetic material such as Ru. When the magnetization pinned layer 13 includes the outer layer 131, the nonmagnetic intermediate layer 132 and the inner layer 133, the direction of the magnetization of the magnetization pinned layer 13 refers to that of the inner layer 133.

If the MR element 10 is a TMR element, the nonmagnetic layer 14 is a tunnel barrier layer. The tunnel barrier layer may be formed by oxidizing a part or the whole of a magnesium layer. If the MR element 10 is a GMR element, the nonmagnetic layer 14 is a nonmagnetic conductive layer. The free layer 15 is formed of, for example, a soft magnetic material such as CoFe, CoFeB, NiFe, or CoNiFe. The protective layer 16 is provided for protecting the layers located thereunder. The protective layer 16 may be formed of Ta, Ru, W, or Ti, for example.

The underlayer 11 is connected to the lower electrode 40, and the protective layer 16 is connected to the bias magnetic field generation unit 20. The MR element 10 is configured to be supplied with current by the lower electrode 40, and the upper electrode 30 that is connected to the bias magnetic field generation unit 20. The current flows in a direction intersecting the layers constituting the MR element 10, such as the first direction (Z direction) which is perpendicular to the layers constituting the MR element 10.

In the MR element 10, the magnetization of the free layer 15 varies depending on the magnetic field applied to the free layer 15. More specifically, the direction and magnitude of the magnetization of the free layer 15 vary depending on the direction and magnitude of the magnetic field applied to the free layer 15. The MR element 10 varies in resistance depending on the direction and magnitude of the magnetization of the free layer 15. For example, if the free layer 15 has a magnetization of a constant magnitude, the MR element 10 has a minimum resistance when the magnetization of the free layer 15 is in the same direction as that of the magnetization pinned layer 13, and has a maximum resistance when the magnetization of the free layer 15 is in the opposite direction to that of the magnetization pinned layer 13.

Reference is now made to FIG. 2 to describe the directions of the magnetizations of the magnetization pinned layers 13 of the MR elements 10A to 10D. In FIG. 2, the arrows labeled 10AP, 10BP, 10CP and 10DP indicate the directions of the magnetizations of the magnetization pinned layers 13 of the MR elements 10A, 10B, 10C and 10D, respectively. As shown in FIG. 2, the direction 10AP of the magnetization of the magnetization pinned layer 13 of the MR element 10A is a third direction parallel to the X direction. The direction 10AP is leftward in FIG. 2. The direction 10BP of the magnetization of the magnetization pinned layer 13 of the MR element 10B is a fourth direction opposite to the third direction. The direction 10BP is rightward in FIG. 2. In this case, the potential at the connection point between the MR elements 10A and 10B varies depending on the strength of a component of the target magnetic field in a direction parallel to the third and fourth directions, i.e., in the X direction. The first output port E1 outputs the first detection signal corresponding to the potential at the connection point between the MR elements 10A and 10B. The first detection signal represents the strength of the component of the target magnetic field in the X direction.

As shown in FIG. 2, the direction 10CP of the magnetization of the magnetization pinned layer 13 of the MR element 10C is the third direction mentioned above, and the direction 10DP of the magnetization of the magnetization pinned layer 13 of the MR element 10D is the fourth direction mentioned above. In this case, the potential at the connection point between the MR elements 10C and 10D varies depending on the strength of the component of the target magnetic field in the direction parallel to the third and fourth directions, i.e., in the X direction. The second output port E2 outputs the second detection signal corresponding to the potential at the connection point between the MR elements 10C and 10D. The second detection signal represents the strength of the component of the target magnetic field in the X direction.

As for the MR element 10A and the MR element 10D, their respective magnetization pinned layers 13 have magnetizations in mutually opposite directions. As for the MR element 10B and the MR element 10C, their respective magnetization pinned layers 13 have magnetizations in mutually opposite directions. Thus, the second detection signal has a phase difference of 180° with respect to the first detection signal.

In consideration of the production accuracy of the MR elements 10A to 10D and other factors, the directions of the magnetizations of the magnetization pinned layers 13 of the MR elements 10A to 10D may be slightly different from the above-described directions.

Now, the bias magnetic field Hb generated by each of the bias magnetic field generation units 20A to 20D will be described with reference to FIG. 2. In FIG. 2, the arrow labeled Hb indicates the direction of the bias magnetic field Hb at the location of the MR element 10 situated nearest the arrow. As shown in FIG. 2, at each of the locations where the MR elements 10A to 10D are placed, the bias magnetic field Hb contains a component in a direction parallel to the Y direction (the second direction). The direction is toward the upper right in FIG. 2. The bias magnetic field Hb is used to make the free layer 15 have a single magnetic domain and to orient the magnetization of the free layer 15 in a certain direction, when the strength of the component of the target magnetic field in the X direction, i.e., in the direction parallel to the magnetization direction of the pinned layer 13, is zero.

In the magnetic sensor system shown in FIG. 1, the magnetic sensor 1 is placed to face the outer circumferential surface of the rotation scale 50 in such a position that the Z direction is parallel or almost parallel to a straight line connecting the location of the magnetic sensor 1 and the central axis C while the X direction is parallel or almost parallel to an imaginary plane perpendicular to the central axis C. In this case, the direction of the principal component of the bias magnetic field Hb at the location of the MR element 10, i.e., the Y direction, is parallel or almost parallel to the central axis C shown in FIG. 1.

Figure 8:
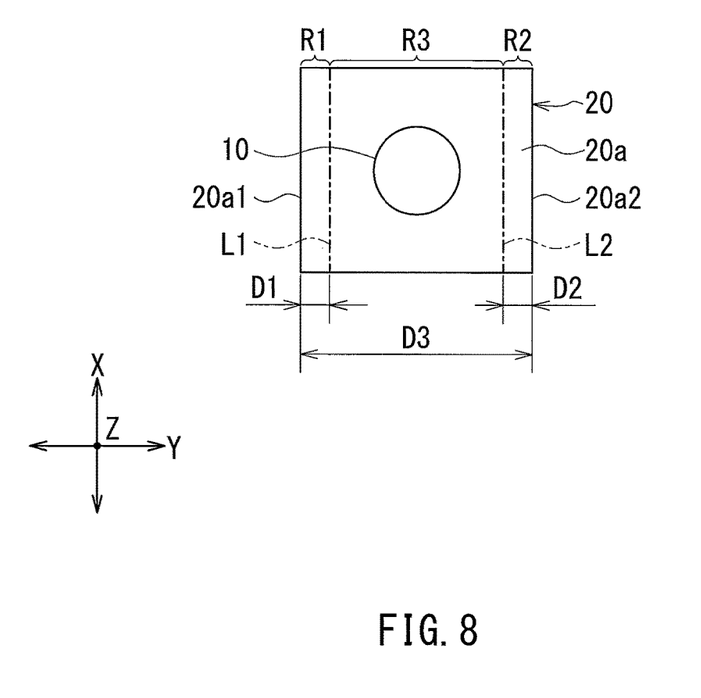
FIG. 8 is a plan view illustrating the positional relationship between the bias magnetic field generation unit and the MR element in the magnetic sensor shown in FIG. 2.
Figure 9:
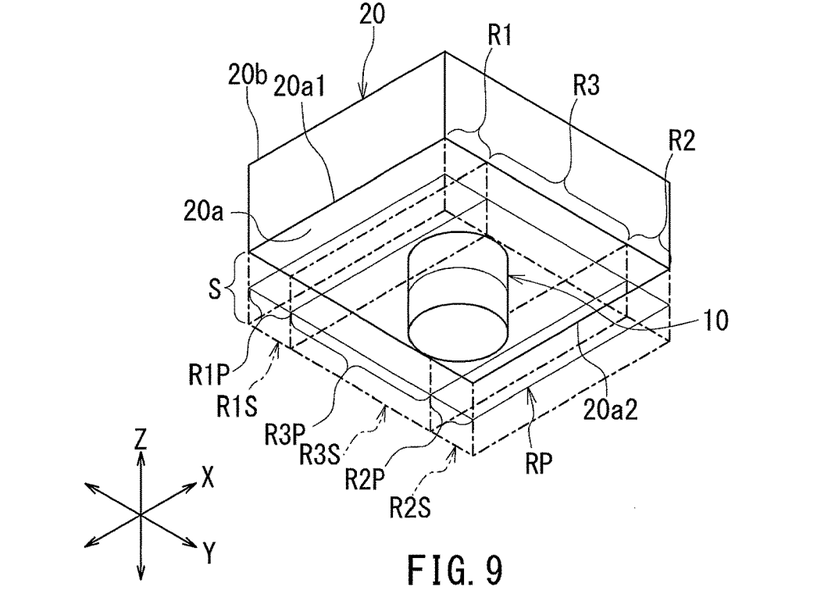
FIG. 9 is a perspective view illustrating the positional relationship between the bias magnetic field generation unit and the MR element in the magnetic sensor shown in FIG. 2.

The positional relationship between the magnetic detection element (the MR element 10) and the bias magnetic field generation unit 20 will now be described with reference to FIG. 2, FIG. 5, FIG. 8 and FIG. 9. FIG. 8 is a plan view illustrating the positional relationship between the bias magnetic field generation unit 20 and the MR element 10 in the magnetic sensor 1 shown in FIG. 2. FIG. 9 is a perspective view illustrating the positional relationship between the bias magnetic field generation unit 20 and the MR element 10 in the magnetic sensor shown in FIG. 2. First, space S is defined as follows. The space S is, as shown in FIG. 5 and FIG. 9, a space formed by shifting an imaginary plane equivalent to the first end face 20a of the bias magnetic field generation unit 20 away from the second end face 20b along the first direction (Z direction). The at least one magnetic detection element is placed such that at least a part of each of the at least one magnetic detection element is contained in the space S. In the first embodiment, in particular, one MR element 10 as the at least one magnetic detection element is placed such that the entirety thereof is contained in the space S.

As shown in FIG. 8 and FIG. 9, the first end face 20a of the bias magnetic field generation unit 20 includes a first end region R1, a second end region R2 and a middle region R3 each of which has an area. The first end region R1 includes a first end 20a1 of the first end face 20a. The first end 20a1 is one of opposite ends of the first end face 20a in the second direction (Y direction). The second end region R2 includes a second end 20a2 of the first end face 20a. The second end 20a2 is the other of the opposite ends of the first end face 20a in the second direction (Y direction). The middle region R3 is located between the first end region R1 and the second end region R2, borders on the first end region R1 along a first border line L1 orthogonal to the second direction, and borders on the second end region R2 along a second border line L2 orthogonal to the second direction. In FIG. 8, the first and second border lines L1 and L2 are each shown in alternate long and short dashed lines.

Now, a first end space R1S, a second end space R2S and a middle space R3S will be defined as follows. As shown in FIG. 9, the first end space R1S, the second end space R2S and the middle space R3S are spaces formed by shifting three imaginary planes equivalent to the first end region R1, the second end region R2 and the middle region R3 away from the second end face 20b of the bias magnetic field generation unit 20 along the first direction (Z direction). One MR element 10 as the at least one magnetic detection element is preferably placed such that the entirety thereof is contained in the middle space R3S. The following will describe an example of such a placement of the MR element 10.

As shown in FIG. 8, the distance between the first end 20a1 and the first border line L1 will be denoted by the symbol D1, the distance between the second end 20a2 and the second border line L2 will be denoted by the symbol D2, and the distance between the first end 20a1 and the second end 20a2 will be denoted by the symbol D3. The distances D1 and D2 are both preferably 10% of the distance D3, and more preferably 35% of the distance D3. The reasons therefor will be described in detail later.

FIG. 2, FIG. 4, FIG. 5, FIG. 8 and FIG. 9 illustrate an example in which only one MR element 10 is situated in the space S or the middle space R3S defined by one bias magnetic field generation unit 20. Alternatively, as will be described later in relation to a second embodiment, a plurality of MR elements 10 may be situated in the space S or the middle space R3S defined by one bias magnetic field generation unit 20.

The function and effects of the magnetic sensor 1 and the magnetic sensor system according to the first embodiment will now be described. In the first embodiment, the bias magnetic field generation unit 20 includes the ferromagnetic layer 22 and the first antiferromagnetic layer 21. The first antiferromagnetic layer 21 is exchange-coupled to the ferromagnetic layer 22. The direction of the magnetization of the ferromagnetic layer 22 is thereby determined. On the basis of the magnetization of the ferromagnetic layer 22, the bias magnetic field generation unit 20 generates the bias magnetic field Hb to be applied to the MR element 10.

Figure 10:
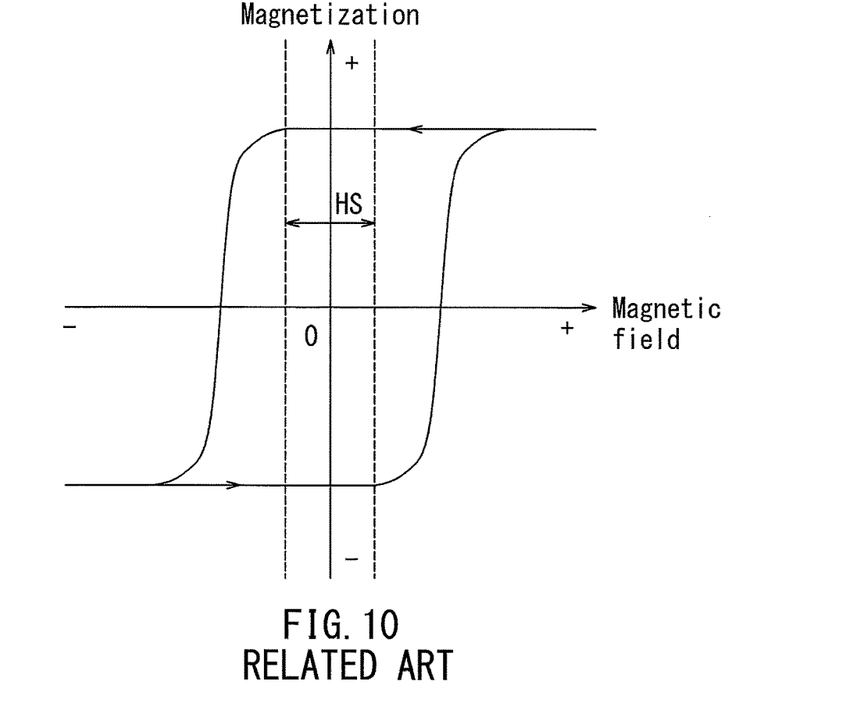
FIG. 10 is a characteristic diagram illustrating the magnetization curve of a permanent magnet.
Figure 11:
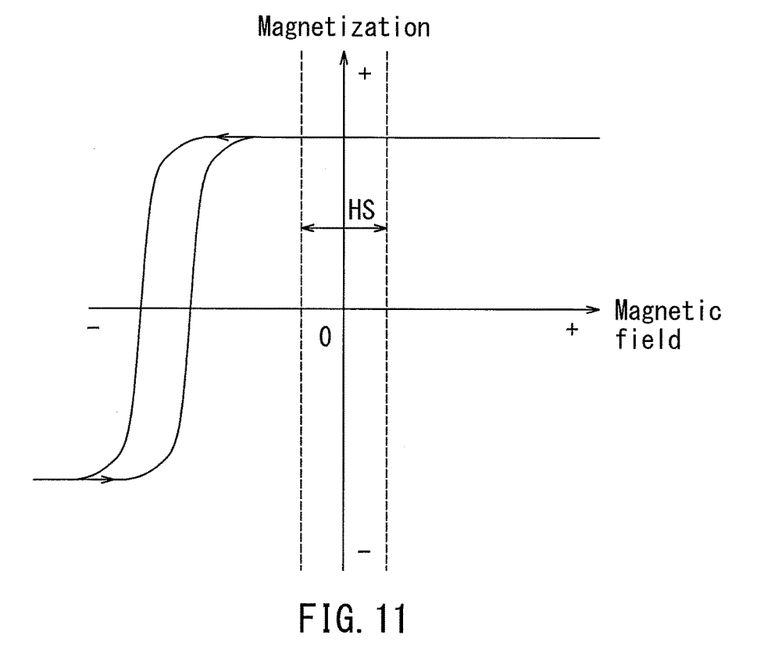
FIG. 11 is a characteristic diagram illustrating the magnetization curve of the bias magnetic field generation unit shown in FIG. 6.

The effects of the magnetic sensor 1 according to the first embodiment will now be described in comparison with a magnetic sensor of a comparative example. The magnetic sensor of the comparative example uses a permanent magnet as the means for generating a bias magnetic field, in place of the bias magnetic field generation unit 20. First, with reference to FIG. 10 and FIG. 11, comparisons will be made between a magnetization curve of the permanent magnet and that of the bias magnetic field generation unit 20. FIG. 10 is a characteristic diagram illustrating the magnetization curve of the permanent magnet. FIG. 11 is a characteristic diagram illustrating the magnetization curve of the bias magnetic field generation unit 20. In each of FIG. 10 and FIG. 11, the horizontal axis represents magnetic field, and the vertical axis represents magnetization. For both of the magnetic field and the magnetization, positive values represent magnitude in a predetermined direction, while negative values represent magnitude in the opposite direction from the predetermined direction. Arrows in the magnetization curves indicate the direction of a change in the magnetic field. The range of the magnetic field indicated with the symbol HS represents the range of the target magnetic field.

The magnetic sensor of the comparative example is used under the condition that the strength of the target magnetic field does not exceed the coercivity of the permanent magnet. However, an external magnetic field having a strength exceeding the coercivity of the permanent magnet can happen to be temporarily applied to the permanent magnet, because the magnetic sensor can be used in various environments. When such an external magnetic field is temporarily applied to the permanent magnet, the direction of the magnetization of the permanent magnet may be changed from an original direction and then remain different from the original direction even after the external magnetic field disappears. For example, as shown in FIG. 10, if an external magnetic field of a positive value beyond the range HS of the target magnetic field is temporarily applied to the permanent magnet, the direction of the magnetization of the permanent magnet is pinned in a positive direction after the external magnetic field disappears. On the other hand, if an external magnetic field of a negative value falling outside the range HS of the target magnetic field is temporarily applied to the permanent magnet, the direction of the magnetization of the permanent magnet is pinned in a negative direction after the external magnetic field disappears. Thus, in the magnetic sensor of the comparative example, a temporary application of an external magnetic field of a strength exceeding the coercivity of the permanent magnet to the permanent magnet may change the direction of the bias magnetic field from a desired direction.

In contrast, in the bias magnetic field generation unit 20 of the first embodiment, as understood from FIG. 11, even if an external magnetic field having a high strength sufficient to reverse the direction of the magnetization of the ferromagnetic layer 22 is temporarily applied, the direction of the magnetization of the ferromagnetic layer 22 returns to an original direction upon disappearance of such an external magnetic field. The first embodiment thus allows application of a stable bias magnetic field Hb to the MR element 10. This advantageous effect is enhanced by providing the bias magnetic field generation unit 20 with the second antiferromagnetic layer 23.

In the first embodiment, at least one MR element 10 is placed such that at least a part of each of the at least one MR element 10 is contained in the space S (see FIGS. 5 and 9) formed by shifting an imaginary plane equivalent to the first end face 20a of the bias magnetic field generation unit 20 away from the second end face 20b along the first direction (Z direction). Thus, in the first embodiment, the ferromagnetic layer 22 and the first antiferromagnetic layer 21, which are included in the bias magnetic field generation unit 20, and the MR element 10 are aligned in the first direction (Z direction). Further, in the first embodiment, the upper electrode 30 and the lower electrode 40 are located on opposite sides of the at least one MR element 10 in the first direction (Z direction), and the bias magnetic field generation unit 20 is located between the upper electrode 30 and the at least one MR element 10. It is thus possible, according to the first embodiment, to fabricate a stack including the bias magnetic field generation unit 20, the MR element 10, the upper electrode 30 and the lower electrode 40 easily in a small number of steps.

In the first embodiment, the protective layer 16 of the MR element 10 is interposed between the free layer 15 of the MR element 10 and the first antiferromagnetic layer 21 of the bias magnetic field generation unit 20. Thus, in the first embodiment no antiferromagnetic layer contacts the free layer 15. The first embodiment is thus free from the problem associated with a contact of an antiferromagnetic layer with the free layer 15.

In the first embodiment, as shown in FIG. 9, at least one MR element 10 is placed such that the entirety of the at least one MR element 10 is contained in the middle space R3S. According to the first embodiment, this makes it possible to apply a bias magnetic field Hb of high uniformity to the MR element 10 and also reduce a variation in the bias magnetic field Hb in response to a variation in the relative positional relationship between the bias magnetic field generation unit 20 and the MR element 10. Such advantageous effects will now be described in detail.

First, a reference plane RP will be defined as follows. As shown in FIG. 9, the reference plane RP is an imaginary plane that intersects the free layer 15 of the MR element 10 and is parallel to the first end face 20a of the bias magnetic field generation unit 20. Further, three regions of the reference plane RP that intersect the first end space R1S, the second end space R2S, and the middle space R3S will be designated as a first projected end region R1P, a second projected end region R2P, and a projected middle region R3P, respectively. A component of the bias magnetic field Hb in the opposite direction to the direction of the magnetization of the ferromagnetic layer 22 in the reference plane RP will be referred to as reference component. The reference component is a principal component of the bias magnetic field Hb to be applied to the MR element 10.

Figure 12:
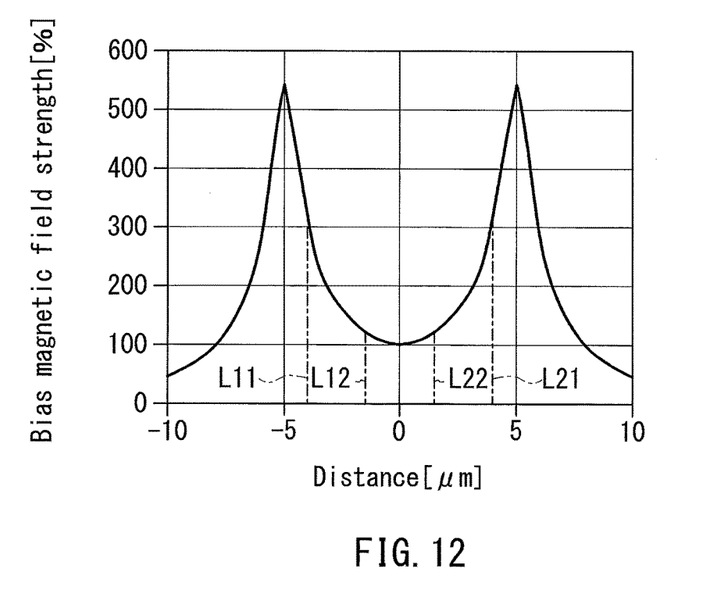
FIG. 12 is a characteristic diagram illustrating the strength distribution of a reference component of a bias magnetic field in the reference plane shown in FIG. 9.

FIG. 12 is a characteristic diagram illustrating the strength of the reference component of the bias magnetic field Hb in the reference plane RP. In FIG. 12, the horizontal axis represents positions on a straight line in the reference plane RP, the straight line being parallel to the Y direction and passing through the center of the projected middle region R3P in the X and Y directions. On the horizontal axis of FIG. 12, the center of the projected middle region R3P in the X and Y directions, which will hereinafter be called the center position, is taken as 0 μm, and positions that are closer to the first end 20a1 (see FIGS. 8 and 9) relative to the center position are represented by negative values, while positions that are closer to the second end 20a2 (see FIGS. 8 and 9) relative to the center position are represented by positive values. The vertical axis represents the strength of the reference component of the bias magnetic field Hb in the reference plane RP. In FIG. 12, the strength of the reference component of the bias magnetic field Hb is normalized to be 100% at the center position.

In FIG. 12, the distance D3 between the first end 20a1 and the second end 20a2 shown in FIG. 8 is taken as 10 μm. In FIG. 12, the two peak positions (the positions of ±5 μm) in the strength of the reference component represent positions at which two imaginary straight lines equivalent to the first end 20a1 and the second end 20a2 intersect the reference plane RP when the two imaginary straight lines are shifted away from the second end face 20b of the bias magnetic field generation unit 20 along the first direction (Z direction). Further, in FIG. 12, the positions of the straight lines labeled L11 and L12 represent positions at which an imaginary straight line equivalent to the first border line L1 situated between the first end region R1 and the middle region R3 shown in FIG. 8 intersects the reference plane RP when the imaginary straight line is shifted away from the second end face 20b of the bias magnetic field generation unit 20 along the first direction (Z direction). The position of the straight line L11 corresponds to the case where the distance D1 between the first end 20a1 and the first border line L1 shown in FIG. 8 is set at 10% of the distance D3. The position of the straight line L12 corresponds to the case where the distance D1 is set at 35% of the distance D3.

Likewise, the positions of the straight lines labeled L21 and L22 represent positions at which an imaginary straight line equivalent to the second border line L2 situated between the second end region R2 and the middle region R3 shown in FIG. 8 intersects the reference plane RP when the imaginary straight line is shifted away from the second end face 20b of the bias magnetic field generation unit 20 along the first direction (Z direction). The position of the straight line L21 corresponds to the case where the distance D2 between the second end 20a2 and the second border line L2 shown in FIG. 8 is set at 10% of the distance D3. The position of the straight line L22 corresponds to the case where the distance D2 is set at 35% of the distance D3.

The distribution of the strength of the reference component between the straight lines L11 and L21 represents the distribution of the strength of the reference component in the projected middle region R3P when both of the distances D1 and D2 are 10% of the distance D3. The distribution of the strength of the reference component between the straight lines L12 and L22 represents the distribution of the strength of the reference component in the projected middle region R3P when both of the distances D1 and D2 are 35% of the distance D3. The distribution of the strength of the reference component between the straight line L11 and the position of −5 μm or between the straight line L12 and the position of −5 μm represents the distribution of the strength of the reference component in the first projected end region R1P. The distribution of the strength of the reference component between the straight line L21 and the position of 5 μm or between the straight line L22 and the position of 5 μm represents the distribution of the strength of the reference component in the second projected end region R2P.

As shown in FIG. 12, the gradient of change in the strength of the reference component versus the change in the position along the second direction (Y direction) is smaller in the projected middle region R3P than in the first and second projected end regions R1P and R2P. Thus, placing the MR element 10 such that the entirety thereof is contained in the middle space R3S makes it possible to apply a bias magnetic field Hb of higher uniformity to the MR element 10 and reduce a variation in the bias magnetic field Hb in response to a variation in the relative positional relationship between the bias magnetic field generation unit 20 and the MR element 10, when compared with the case of placing the MR element 10 such that a part or the entirety of the MR element 10 is situated outside the middle space S3S.

According to FIG. 12, when both of the distances D1 and D2 are 10% of the distance D3, the strength of the reference component of the bias magnetic field Hb in the projected middle region R3P falls within the range of 100% to 300% of the strength of the reference component at the center position mentioned above. Further, when both of the distances D1 and D2 are 35% of the distance D3, the strength of the reference component of the bias magnetic field Hb in the projected middle region R3P falls within the range of 100% to 120% of the strength of the reference component at the center position. From the standpoint of reducing a variation in the strength of the reference component of the bias magnetic field Hb in the middle space R3S in which the MR element 10 is placed, both of the distances D1 and D2 are preferably 10% of the distance D3, and more preferably 35% of the distance D3.

Second Embodiment

Figure 13:
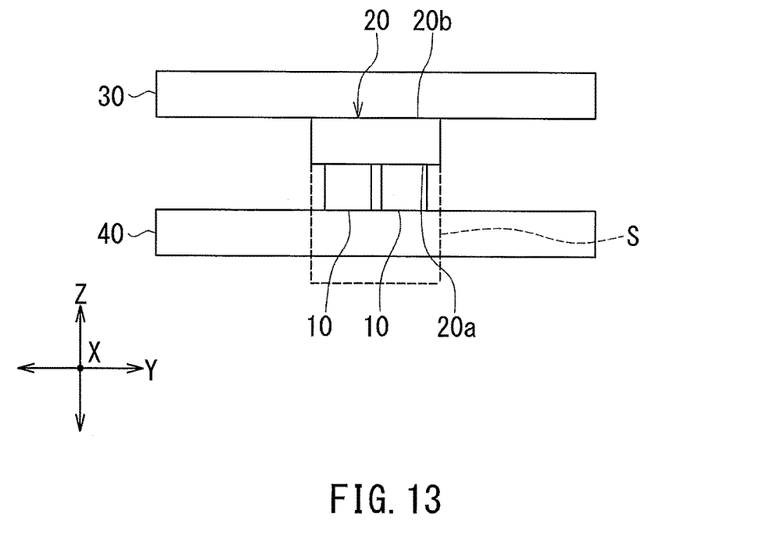
FIG. 13 is an enlarged side view of a portion of a magnetic sensor according to a second embodiment of the invention.

A second embodiment of the invention will now be described with reference to FIG. 13. FIG. 13 is an enlarged side view of a portion of a magnetic sensor according to the second embodiment. The magnetic sensor 1 according to the second embodiment includes eight MR elements 10, four bias magnetic field generation units 20, a substrate (not illustrated), two upper electrodes (first electrodes) 30, and two lower electrodes (second electrodes) 40. In the second embodiment, two MR elements 10 connected in parallel by the upper and lower electrodes 30 and 40 are placed at each of the locations of the MR elements 10A, 10B, 10C and 10D described in the first embodiment section.

In the second embodiment, the two MR elements 10 connected in parallel are placed such that at least a part of each of the two MR elements 10 is contained in the space S defined by a corresponding bias magnetic field generation unit 20. The magnetization pinned layers 13 of the two MR elements 10 are magnetized in the same direction. The two MR elements 10 are preferably placed such that the entirety of each of the two MR elements 10 is contained in the middle space R3S described in the first embodiment section. In that case, it is possible to apply bias magnetic fields Hb of high uniformity to the two MR elements 10 and to reduce a difference in strength between the bias magnetic fields Hb to be applied to the two MR elements 10.

The remainder of configuration, function and effects of the second embodiment are similar to those of the first embodiment.

Third Embodiment

Figure 14:
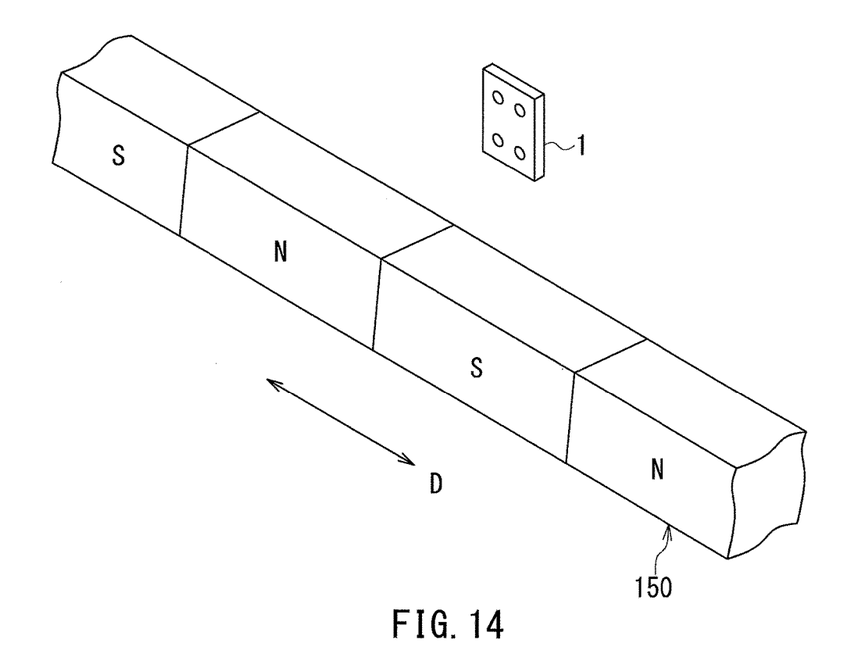
FIG. 14 is a perspective view illustrating the general configuration of a magnetic sensor system of a third embodiment of the invention.

A third embodiment of the invention will now be described with reference to FIG. 14. FIG. 14 is a perspective view illustrating the general configuration of a magnetic sensor system of the third embodiment. The magnetic sensor system of the third embodiment differs from that of the first embodiment in the following ways. The magnetic sensor system of the third embodiment has a linear scale 150 in place of the rotation scale 50. The linear scale 150 has a plurality of pairs of N and S poles arranged alternately in a linear configuration. The linear scale 150 has a side surface parallel to the direction in which the N and S poles are arranged. The magnetic sensor 1 is placed to face the side surface of the linear scale 150.

One of the linear scale 150 and the magnetic sensor 1 moves linearly in a predetermined direction D in response to the movement of a moving object (not illustrated). This causes a change in the relative position of the linear scale 150 with respect to the magnetic sensor 1 in the direction D. The direction D is the direction in which the N and S poles of the linear scale 150 are arranged. The magnetic sensor system detects, as the physical quantity associated with the relative positional relationship between the linear scale 150 and the magnetic sensor 1, the position and/or speed of the aforementioned moving body moving with one of the linear scale 150 and the magnetic sensor 1, for example.

In the third embodiment, the target magnetic field is generated by the linear scale 150, and the direction of the target magnetic field varies with changes in the relative position of the linear scale 150 with respect to the magnetic sensor 1.

The magnetic sensor 1 may be configured in the same manner as the first or second embodiment. The remainder of configuration, function and effects of the third embodiment are similar to those of the first or second embodiment.

The present invention is not limited to the foregoing embodiments, and various modifications may be made thereto. For example, as far as the requirements of the appended claims are met, the shape and location of the bias magnetic field generation unit 20, and the number, shape and location of the MR element 10 need not necessarily be as in the respective examples illustrated in the foregoing embodiments, and can be freely chosen.

Further, the MR element 10 may be formed by stacking the underlayer 11, the free layer 15, the nonmagnetic layer 14, the magnetization pinned layer 13, the antiferromagnetic layer 12, and the protective layer 16 in this order from the bottom.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A magnetic sensor comprising:
  at least one magnetic detection element for detecting a magnetic field to be detected; and
  a bias magnetic field generation unit for generating a bias magnetic field to be applied to the at least one magnetic detection element, wherein
  the bias magnetic field generation unit and the at least one magnetic detection element are stacked along a first direction, the bias magnetic field generation unit being arranged outside the at least one magnetic detection element in the first direction and having a location in the first direction that is different from a location of the at least one magnetic detection element in the first direction,
  the bias magnetic field generation unit includes a ferromagnetic layer and a first antiferromagnetic layer that are stacked along the first direction, and has a first end face and a second end face located at opposite ends in the first direction,
  the ferromagnetic layer has a first surface and a second surface located at opposite ends in the first direction,
  the first antiferromagnetic layer is in contact with the first surface of the ferromagnetic layer and exchange-coupled to the ferromagnetic layer, and
  the first antiferromagnetic layer is placed between at least a part of each of the at least one magnetic detection element and the ferromagnetic layer along the first direction.

2. The magnetic sensor according to claim 1, wherein
the ferromagnetic layer has a magnetization in a direction parallel to a second direction orthogonal to the first direction, and
the bias magnetic field at a location where the at least one magnetic detection element is placed contains a component in a direction opposite to the direction of the magnetization of the ferromagnetic layer.

3. The magnetic sensor according to claim 2, wherein
the first end face of the bias magnetic field generation unit includes a first end region, a second end region and a middle region each of which has an area,
the first end region includes a first end of the first end face, the first end being one of opposite ends of the first end face in the second direction,
the second end region includes a second end of the first end face, the second end being the other of the opposite ends of the first end face in the second direction,
the middle region is located between the first end region and the second end region, borders on the first end region along a first border line orthogonal to the second direction, and borders on the second end region along a second border line orthogonal to the second direction, and
the at least one magnetic detection element is placed such that an entirety of the at least one magnetic detection element is aligned with the middle region along the first direction.

4. The magnetic sensor according to claim 3, wherein a distance between the first end and the first border line, and a distance between the second end and the second border line are both 10% of a distance between the first end and the second end.

5. The magnetic sensor according to claim 3, wherein a distance between the first end and the first border line, and a distance between the second end and the second border line are both 35% of a distance between the first end and the second end.

6. The magnetic sensor according to claim 1, wherein the at least one magnetic detection element is at least one magnetoresistance element.

7. The magnetic sensor according to claim 6, wherein
the at least one magnetoresistance element includes a magnetization pinned layer having a magnetization pinned in a certain direction, a free layer having a magnetization that varies depending on the magnetic field to be detected, and a nonmagnetic layer located between the magnetization pinned layer and the free layer, and
the magnetization pinned layer, the nonmagnetic layer and the free layer are stacked along the first direction.

8. The magnetic sensor according to claim 7, further comprising a first electrode and a second electrode for supplying current to the at least one magnetoresistance element, the first and second electrodes being located on opposite sides of the at least one magnetoresistance element in the first direction,
wherein the bias magnetic field generation unit is located between the first electrode and the at least one magnetoresistance element.

9. The magnetic sensor according to claim 1, wherein the bias magnetic field generation unit further includes a second antiferromagnetic layer that is in contact with the second surface of the ferromagnetic layer and exchange-coupled to the ferromagnetic layer.

* * * * *